(12) United States Patent
Ritter et al.

(10) Patent No.: US 10,306,764 B2
(45) Date of Patent: May 28, 2019

(54) VARIABLE SENSOR INTERFACE FOR A CONTROL UNIT

(71) Applicant: Schaeffler Technologies AG & Co. KG, Herzogenaurach (DE)

(72) Inventors: Daniel Ritter, Karlsruhe (DE); Steffen Linz, Buhl (DE); Thomas Wacker, Buhlertal (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 320 days.

(21) Appl. No.: 15/304,655

(22) PCT Filed: Mar. 20, 2015

(86) PCT No.: PCT/DE2015/200183
§ 371 (c)(1),
(2) Date: Oct. 17, 2016

(87) PCT Pub. No.: WO2015/158340
PCT Pub. Date: Oct. 22, 2015

(65) Prior Publication Data
US 2017/0048979 A1    Feb. 16, 2017

(30) Foreign Application Priority Data
Apr. 15, 2014   (DE) .............. 10 2014 207 226

(51) Int. Cl.
*H02H 7/00*     (2006.01)
*H05K 1/18*     (2006.01)
(Continued)

(52) U.S. Cl.
CPC ............. *H05K 1/18* (2013.01); *B60R 16/023* (2013.01); *H02H 7/20* (2013.01); *H05K 1/0259* (2013.01); *H05K 1/0289* (2013.01); *H05K 1/111* (2013.01); *H05K 1/029* (2013.01); *H05K 1/0295* (2013.01); *H05K 3/222* (2013.01); *H05K 2201/09954* (2013.01); *H05K 2201/10015* (2013.01); *H05K 2201/10022* (2013.01);
(Continued)

(58) Field of Classification Search
None
See application file for complete search history.

(56) References Cited

U.S. PATENT DOCUMENTS 6,467,163 B1    10/2002   Laschinski
7,391,620 B2 *   6/2008   Fauh .................... H05K 1/0265
                                                          361/763
(Continued)

FOREIGN PATENT DOCUMENTS

CN         103067941         4/2013
CN         203358668        12/2013
(Continued)

*Primary Examiner* — Stephen W Jackson
(74) *Attorney, Agent, or Firm* — Volpe and Koenig, P.C.

(57) ABSTRACT

The invention relates to a variable sensor interface for a control unit, this variable sensor interface including a circuit board which is provided with components. In a sensor interface which can easily be used for the use of different sensor types, the circuit board has a predefined conductive track layout having a plurality of predefined mounting locations, the mounting locations being provided with components in a sensor-specific manner.

9 Claims, 1 Drawing Sheet

(51) Int. Cl.
   *H05K 1/02*      (2006.01)
   *H05K 1/11*      (2006.01)
   *B60R 16/023*    (2006.01)
   *H02H 7/20*      (2006.01)
   *H05K 3/22*      (2006.01)

(52) U.S. Cl.
   CPC .............. *H05K 2201/10151* (2013.01); *H05K 2201/10636* (2013.01); *H05K 2203/173* (2013.01); *Y02P 70/611* (2015.11)

(56) References Cited

U.S. PATENT DOCUMENTS

| | | |
|---|---|---|
| 8,744,683 B2 | 6/2014 | Henke et al. |
| 2008/0130255 A1 | 6/2008 | Noguchi |
| 2010/0051339 A1 | 3/2010 | Ou et al. |

FOREIGN PATENT DOCUMENTS

| | | |
|---|---|---|
| DE | 102004052495 | 5/2006 |
| DE | 102006046834 | 4/2008 |
| WO | 9844768 | 10/1998 |

\* cited by examiner

VARIABLE SENSOR INTERFACE FOR A CONTROL UNIT

BACKGROUND

The invention relates to a variable sensor interface for a control device, comprising a circuit board which is equipped with components for connecting at least one external sensor.

Control devices are used in automotive technology, receiving signals from a plurality of sensors arranged distributed in motor vehicles. These sensors are guided to a sensor interface inside the control device. A control device in a steering system of a motor vehicle is known from DE 10 2006 046 834 A1, which is connected to a magnetic field sensor to determine a steering angle, which sensor determines the rotor position of the rotor shaft of an electric motor.

In many cases the control device is not only connected to one sensor but to various sensor types, which require different interface circuits. These interface circuits may represent for example a current interface, a PWM interface, an analog interface, or the like. Furthermore, passive as well as active sensors are connected. This variety of sensor types requires that a specifically defined sensor interface must be provided for each sensor type, which is installed in the control device. Based on this plurality of sensors the interface must be prepared concretely for the sensors to be connected, which largely increases the number of sensor interfaces to be rendered available.

SUMMARY

The invention is therefore based on the objective to provide a sensor interface for a control device to which various sensor types can be easily connected.

According to the invention the objective is attained such that the circuit board exhibits a conductive track layout with a plurality of predetermined mounting locations for components, with the mounting locations being allowed to be equipped with sensor specific components. By way of such flexibility, here various configurations of sensors can be connected to a control device without requiring any change of the specifically predetermined conductive track layout. Accordingly, the provision of various interfaces for the respective sensor types can be waived, because the variable sensor interface can be varied by a simple equipment of selected mounting locations with components. This way the interface variety is limited and the production costs are reduced.

Advantageously, a predetermined number of resistors and/or capacitors can be specifically connected to various mounting locations for each sensor. This variable sensor interface therefore provides a circuit for resistors and capacitors by providing assembly options, which with minimum expense and without changing the conductive track layout of the circuit board is suitable for various sensor types.

In one embodiment, a protective circuit for transient interferences and/or ESD (electrostatic discharge) can be specifically connected to at least one mounting location for one sensor.

In one variant, an overcurrent protection circuit can be connected to at least one of the mounting locations. In case of short circuits, such an overcurrent protection circuit limits the amperage and thus protects the control device from damage.

In one embodiment the overcurrent protection circuit is arranged in one or more current paths of the conductive track layout, which provides the operating voltage or the ground for the external sensor. Here, the arrangement occurs in the supply path for protecting from short circuitry to the ground and/or in the ground path for protecting from short circuitry towards the battery voltage or another voltage.

A further development of the invention relates to a control device for a motor vehicle, which can be connected to at least one external sensor by the external sensor being connected to a sensor-interface. In a control device to which a plurality of sensor types can be connected the sensor-interface is embodied according to at least one feature of this patent application. Such a control device is provided for connecting various sensor types. Here, it is particularly advantageous that the sensor interface can be embodied according to each sensor type without requiring that any change of the conductive track layout occurs on the circuit board of the sensor interface.

Advantageously, each input and/or output of the sensor interface can be switched with a protective circuit for transient interferences and/or ESD. This is advantageous in that the electromagnetic interferences are already detected and intercepted at the location of their entering the control device.

BRIEF DESCRIPTION OF THE DRAWINGS

The invention allows numerous embodiments. Two of them shall be explained in greater detail based on the figures shown in the drawing.

Shown are.

Identical features are marked with the same reference characters.

DETAILED DESCRIPTION OF THE PREFERRED EMBODIMENTS

Figure 1:
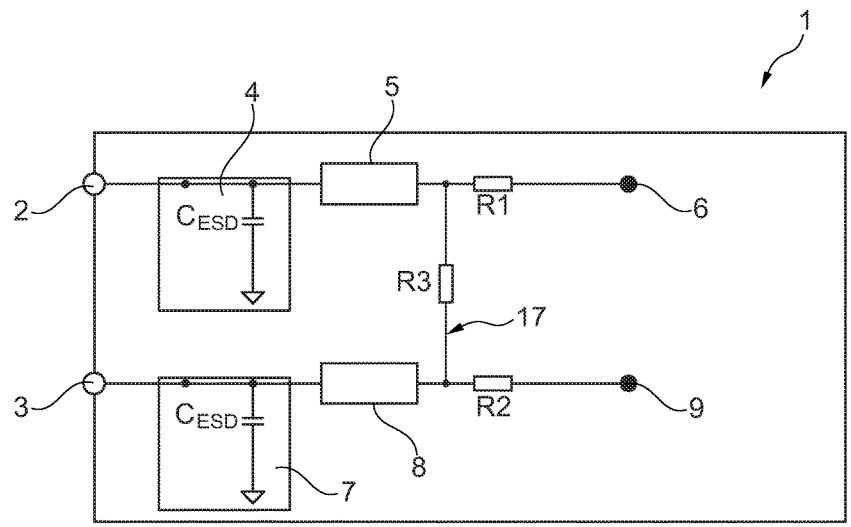
FIG. 1: a first exemplary embodiment of the control device according to the invention.

FIG. 1 shows a first exemplary embodiment of a control device 1, as used for example in a motor vehicle. Here, the control device 1 has two outputs 2, 3 for the energy supply of external sensors, which are not shown in greater detail. The output 2 is switched with a first protective circuit 4 for transient interferences and ESD, which are switched serially with a first overcurrent protection circuit 5. This overcurrent protective circuit 5 is connected via a first resistor R1 to a first voltage source 6 of the control device 1. In case of short circuitry, the overcurrent protection circuit 5 limits the current of the supply voltage 6 at the output 2 and this way prevents any damage of the control device 1.

The second output 3 of the control device 1 is also connected via a second protection circuit 7 for transient interferences and ESD, which leads to a second overcurrent protection circuit 8. This second overcurrent protection circuit 8 is connected via the resistor R2 to a second voltage source 9 of the control device 1. A third resistor R3 is arranged between the first overcurrent protection circuit 5 and the first resistor R1 as well as the second overcurrent protective circuit 8 and the second resistor R2. By the assembly options of the resistors R1, R2, and R3 the two supply voltages 6, 9 of the control device 1 can be combined arbitrarily for the two outputs 2, 3. This is shown in greater detail in table 1.

TABLE 1

| First output 2 | Second output 3 | R1 | R2 | R3 |
|---|---|---|---|---|
| Voltage source 6 | Voltage source 6 | 0 Ohm | Not equipped | 0 Ohm |
| Voltage source 6 | Voltage source 9 | 0 Ohm | 0 Ohm | Not equipped |
| Voltage source 9 | Voltage source 9 | Not equipped | 0 Ohm | 0 Ohm |

Here, the identification "not equipped" shall indicate an interruption in the conductive track layout 17. If the resistance amounts to 0 Ohm, a resistor bridge is provided in the conductive track layout 17.

Figure 2:
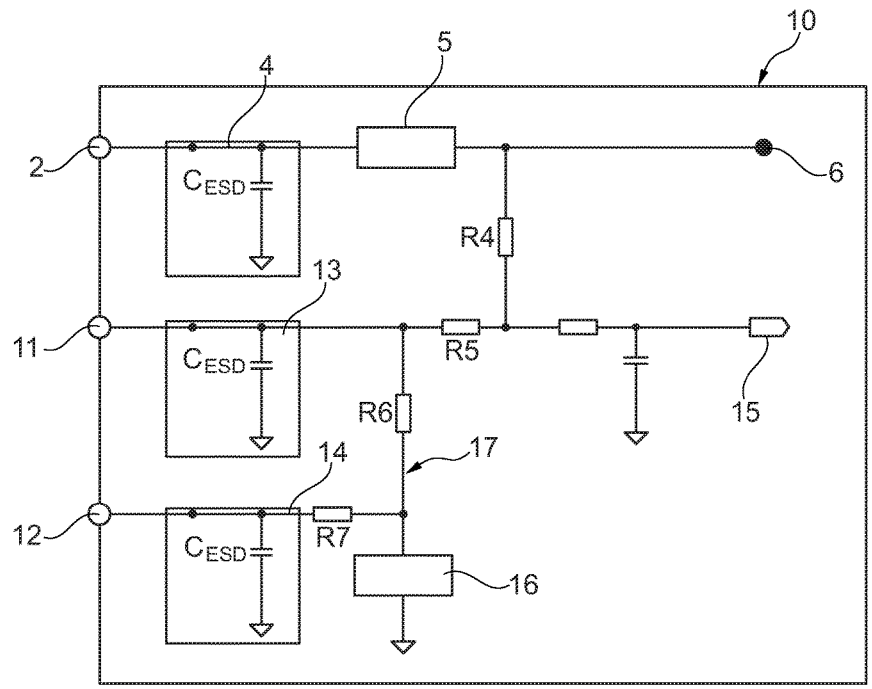
FIG. 2: a second exemplary embodiment of the control device according to the invention.

FIG. 2 shows a second exemplary embodiment of a control device 10, which in addition to the output 2 for an external sensor provides two inputs 11, 12 for the external sensor. The output 2 is connected to the voltage source 6 via the first protection circuit 4 for transient interferences and ESD and via the first overcurrent protection circuit 5. The inputs 11 and 12 are each connected to a second and/or a third protective circuit 13, 14 for transient interferences and ESD. The second protective circuit 13 for transient interferences leads via a resistor R5 and a filter resistor $R_{Filter}$ to an internal input 15 of the control device 10, at which either an analog/digital converter, now shown in greater detail, can be connected or a digital PWM-input. The filter resistor $R_{Filter}$ is connected via a capacitor $C_{Filter}$ to the ground. The second protective circuit 13 for transient interferences and ESD is connected via a resistor R6 and the third protection circuit 14 for transient interferences and ESD via a resistor R7 to an overcurrent protection circuit 16, which in turn leads to the ground.

In the case to be discussed further the protective circuits 4, 13, 14 for transient interferences and ESD as well as the filter resistor $R_{Filter}$ and the filter capacitor $C_{Filter}$ are mandatory. The filter resistor $R_{Filter}$ and the filter capacitor $C_{Filter}$ are required according to EMC-specifications (EMC-electromagnetic compatibility). However, applications are also possible in which the filter resistor $R_{Filter}$ and the filter capacitor $C_{Filter}$ can be waived. The resistors R4 to R7 represent assembly options. Depending on the application, the value of the filter resistance $R_{Filter}$ and/or the filter capacitor $C_{Filter}$ must be adjusted, which occurs depending on the speed the sensor signals change. In table 2 the potential interface types shall be shown, which are realized with the resistors R4 to R7 by the various assembly options.

TABLE 2

| Interface type | R4 | R5 | R6 | R7 |
|---|---|---|---|---|
| Resistance/temperature sensor (NTC, PCT, . . . ) | Equipped with 1% R | 0 Ohm | Not equipped | 0 Ohm |
| 2-pin current interface | Not equipped | 0 Ohm | Equipped | Not equipped |
| 3-pin PWM interface (open collector) | Equipped | 0 Ohm | Not equipped | 0 Ohm |
| Passive inductive speed sensor | Equipped | Equipped | Equipped | 0 Ohm |
| Analog voltage | Not equipped | 0 Ohm | Not equipped | 0 Ohm |
| Analog current | Not equipped | 0 Ohm | Equipped | 0 Ohm |

When using resistance and/or temperature sensors the inputs of the external sensor are switched to the inputs 11 and 12. The output 2 remains open. R4 represents a reference resistor, here.

In case of a 2-pin current interference the connection of the external sensor occurs to the output 2 and to the input 11. The input 12 remains open. R6 is here a current/voltage converter resistor.

If a 3-pin PWM-interface is used, the connection of the voltage supply occurs from the external sensor to the output 2 and the input 12. The input 11 is used as the input for the sensor signal and R4 is embodied as a pull-up resistor.

If the external sensor is embodied as a passive inductive speed sensor, the connections of the external sensor occur to the inputs 11 and 12. The output 2 remains open, while the resistors R4 and R5 serve to provide the signal with an offset, in order to allow feeding an analog-digital converter at the inner input 15. This way it is ensured that the sensor signal is always in the positive voltage range.

If the external sensor applied at the control device shows an analog voltage the voltage supply of the external sensor occurs by the output 2 and the input 12. The input 11 is the input for the sensor signal.

If the external sensor provides an analog current, the connection of the voltage supply of the external sensor occurs at the output 2 and at the input 12. The input 11 is the input of the sensor signal and the resistor R6 is a current/voltage converter resistor.

The variable interface explained is suitable for any type of control device, in which the connection of various sensors is provided. The particular advantage comprises that the circuit can be adjusted to the respective external sensor without any change of the conductive track layout of the circuit board being necessary, but only the assembly of the resistors needs to be adjusted.

LIST OF REFERENCE CHARACTERS 1 control device
2 output
3 output
4 protection circuit for transient interferences and ESD
5 overcurrent protection circuit
6 voltage source
7 protection circuit for transient interferences and ESD
8 overcurrent protection circuit
9 voltage source
10 control device
11 input
12 inlet
13 protection circuit for transient interferences and ESD
14 protection circuit for transient interferences and ESD
15 internal input
16 overcurrent protection circuit
17 conductive track layout
R1 resistor
R2 resistor
R3 resistor
R4 resistor
R5 resistor
R6 resistor
R7 resistor
$R_{Filter}$ resistor
$C_{Filter}$ capacitor

The invention claimed is:
1. A variable sensor-interface for a control device, the variable sensor-interface comprising:
 a circuit board equipped with components, the circuit board including at least two outputs for providing an energy supply to at least two external sensors, the at least two external sensors being non-identical types of sensors, the circuit board includes a conductive track layout with a plurality of predetermined mounting locations for the components, allowing the mounting locations to be equipped with sensor-specific components.

2. The sensor-interface according to claim 1, wherein the components include a predetermined number of at least one of resistors or capacitors ($C_F$) that are sensor-specifically connected to various mounting locations.

3. The sensor-interface according to claim 1, wherein the components include at least one protective circuit for at least one of transient interferences or electrostatic discharge (ESD) is connectable to the mounting locations.

4. The sensor-interface according to claim 1, wherein the components include at least one overcurrent protection circuit that is connectable to the mounting locations.

5. The sensor-interface according to claim 4, wherein the overcurrent protection circuit is arranged on one of the mounting locations, which is located in one or more current paths of the conductive track layout, providing a supply voltage or ground for at least one external sensor of the at least two external sensors.

6. A control device for a motor vehicle which is connected to at least two different sensors, which is connected to the sensor-interface according to claim 1.

7. The control device according to claim 6, wherein at least one of an input or output of the sensor-interface is switched with a protection circuit for at least one of transient interferences or electrostatic discharge (ESD).

8. The control device according to claim 6, wherein each input or output of the sensor-interface is switched with a protection circuit for at least one of transient interferences or electrostatic discharge (ESD).

9. A variable sensor-interface for a control device, the variable sensor-interface comprising:
a circuit board including a first circuit and a second circuit,
the first circuit including a first voltage source, a first resistor, a first overcurrent protection circuit, a first protective circuit for at least one of transient interferences or electrostatic discharge (ESD), and a first energy supply output configured to supply voltage to a first external sensor,
the second circuit including a supply voltage source, a second resistor, a second overcurrent protection circuit, a second protective circuit for at least one of transient interferences or electrostatic discharge (ESD), and a second energy supply output configured to supply voltage to a second external sensor, the second external sensor being a different sensor type than the first external sensor; and
a conductive track with a plurality of predetermined mounting locations for components that allows the predetermined mounting locations to be equipped with sensor-specific components, the conductive track connecting the first circuit to the second circuit.

* * * * *